United States Patent
Shin et al.

(10) Patent No.: US 10,541,717 B1
(45) Date of Patent: Jan. 21, 2020

(54) CASCADED TRANSMIT AND RECEIVE LOCAL OSCILLATOR DISTRIBUTION NETWORK

(71) Applicant: Intel Corporation, Santa Clara, CA (US)

(72) Inventors: Woorim Shin, Portland, OR (US); Christopher Hull, Portland, OR (US); Steven Callender, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/124,573

(22) Filed: Sep. 7, 2018

(51) Int. Cl.
*H04B 1/408* (2015.01)
*H03D 7/12* (2006.01)

(52) U.S. Cl.
CPC .............. *H04B 1/408* (2013.01); *H03D 7/12* (2013.01)

(58) Field of Classification Search
CPC .................................. H04B 1/408; H03D 7/12
See application file for complete search history.

(56) References Cited

U.S. PATENT DOCUMENTS

| | | | | |
|---|---|---|---|---|
| 6,812,824 B1 * | 11/2004 | Goldinger | ............... | G06K 17/00 340/10.1 |
| 7,068,171 B2 * | 6/2006 | Gardenfors | ............ | H04B 1/408 340/572.1 |
| 7,415,286 B2 | 8/2008 | Behzad | | |
| 8,031,019 B2 | 10/2011 | Chawla et al. | | |
| 8,929,840 B2 * | 1/2015 | Aniruddhan | ......... | H03D 7/1441 455/118 |
| 9,331,632 B2 * | 5/2016 | Lee | ........................... | H03D 9/00 |
| 2003/0067359 A1 * | 4/2003 | Darabi | ................... | H03B 21/01 331/46 |
| 2007/0173286 A1 | 7/2007 | Carter et al. | | |
| 2008/0290953 A1 * | 11/2008 | Sandner | .................... | H03L 7/23 331/2 |
| 2009/0075620 A1 * | 3/2009 | Aniruddhan | ......... | H03D 7/1441 455/326 |
| 2009/0111414 A1 * | 4/2009 | Sahota | ................. | H03D 7/1441 455/232.1 |

(Continued)

OTHER PUBLICATIONS

Sarkas, Ioaanis et al; "An 18Gb/s, Direct QPSK Modulation SiGe BiCMOS Transceiver for Last Mile Links in the 70-80 GHz Band"; IEEE Journal of Solid-State Circuits, vol. 45, No. 10; Oct. 2010.

(Continued)

*Primary Examiner* — Lewis G West
(74) *Attorney, Agent, or Firm* — Eschweiler & Potashnik, LLC

(57) ABSTRACT

Systems, methods, and circuitries are provided for a local oscillator (LO) signal distribution. An exemplary LO distribution network includes a common LO buffer configured to buffer an LO signal, a receive (RX) LO buffer, and a transmit (TX) mixer in a cascaded arrangement. The RX LO buffer is configured to receive the LO signal and buffer the LO signal and to provide the LO signal to an RX mixer. A first LO signal line and a second LO signal line are configured to conduct the LO signal from the common LO buffer to the RX LO buffer. The RX LO buffer is coupled to the first LO signal line and the second LO signal line. The TX mixer is also coupled to the first LO signal line and the second LO signal line.

14 Claims, 9 Drawing Sheets

(56) References Cited

U.S. PATENT DOCUMENTS

| | | | | |
|---|---|---|---|---|
| 2009/0253382 A1* | 10/2009 | Haralabidis | ............ | H04B 1/005 |
| | | | | 455/73 |
| 2009/0298415 A1* | 12/2009 | Gudem | ................ | H03F 1/0244 |
| | | | | 455/1 |
| 2011/0234293 A1* | 9/2011 | Shanan | .................. | H03B 19/00 |
| | | | | 327/361 |
| 2013/0281029 A1* | 10/2013 | Lee | ......................... | H03D 7/12 |
| | | | | 455/73 |
| 2014/0098906 A1* | 4/2014 | Gudem | ................ | H04B 1/0483 |
| | | | | 375/297 |
| 2016/0277058 A1* | 9/2016 | Zhai | ......................... | H04B 1/44 |
| 2018/0006855 A1* | 1/2018 | Lee | ......................... | H04L 27/20 |

OTHER PUBLICATIONS

Furqan, Muhammad et al; "A 122-GHz System-In-Package Radar Sensor with BPSK Modulator in a 130-nm SiGe BiCMOS Technology"; Proceedings of the 46th European Microwave Conference; London, UK; Oct. 4-6, 2016.

* cited by examiner

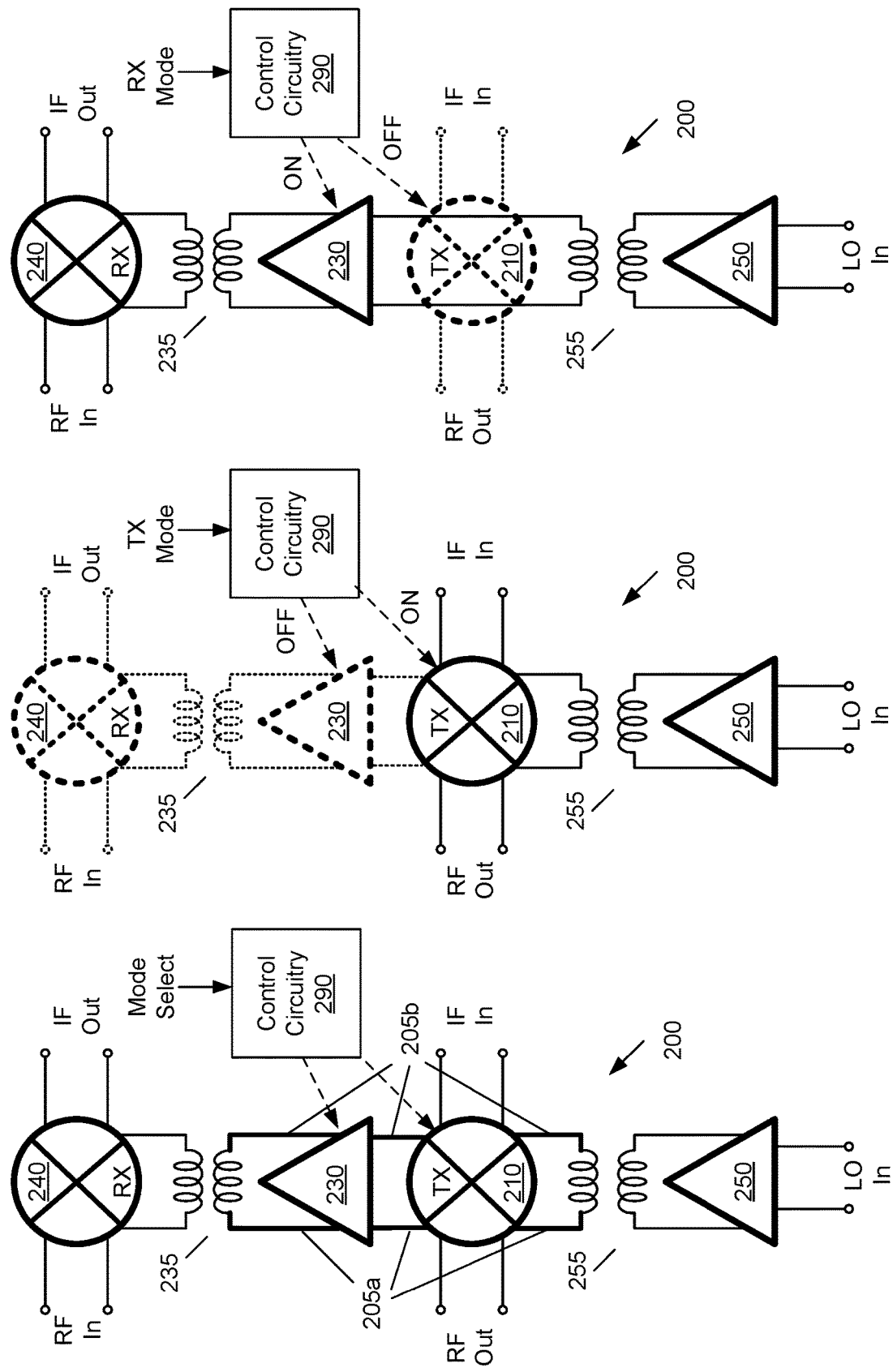

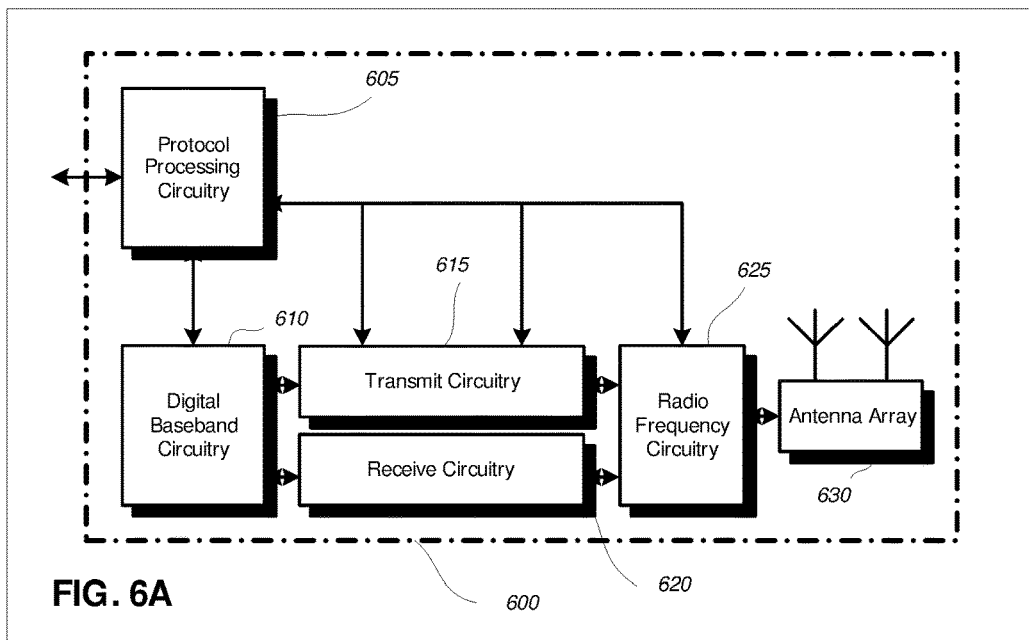
FIG. 6A
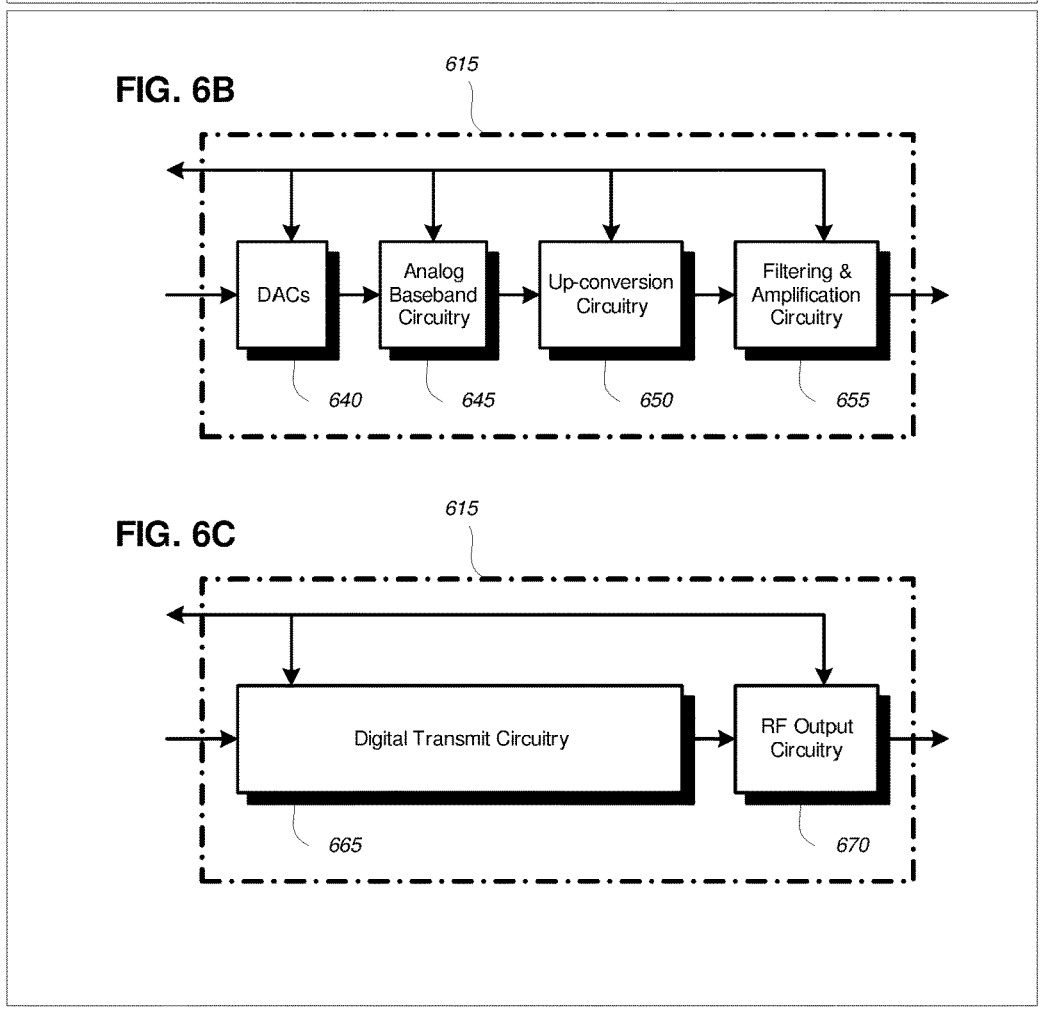
FIG. 6B
FIG. 6C
Fig. 6

US 10,541,717 B1

CASCADED TRANSMIT AND RECEIVE LOCAL OSCILLATOR DISTRIBUTION NETWORK

BACKGROUND

Local oscillator (LO) signals are used to synchronize the operation of analog circuit components in a device. As operating frequencies for devices increases, so does the frequency of the LO signals that are routed throughout the devices.

BRIEF DESCRIPTION OF THE DRAWINGS

FIGS. 2A-2C illustrate an exemplary LO signal distribution network that includes a TX mixer and RX LO buffer arranged in a cascaded manner in accordance with various aspects described.

FIGS. 6A-6C illustrate examples for an exemplary communication circuitry in accordance with various aspects described.

DESCRIPTION

The design of on-chip LO signal distribution becomes increasingly challenging as operating frequencies for electronic devices goes up to the millimeter-wave (e.g., 30-300 GHz) frequency ranges. Power consumption for LO buffers increases as operating frequency increases, and the phase noise requirements become harder to meet for a given error vector magnitude (EVM) specification. It also becomes difficult to maintain gain and phase balance between different clock phases as frequency response becomes more sensitive to mismatches in layout parasitic elements. Also, as resonant-based buffers with inductors or transformers are often preferred to deliver enough power to the load in distant locations, efficient use of layout area becomes more important at higher frequencies.

Therefore, overall layout floor planning of integrated millimeter-wave transceivers is often heavily dependent on the LO distribution scheme. This limits flexibility in block-level placement and can potentially limit scalability in phased-array systems. Moreover, LO signal branching for the TX mixer and the RX mixer often results in an additional buffer stage which consumes power and layout area. Complicated routing might also require metal cross-overs, which can increase signal coupling and degrade gain/phase imbalance.

Figure 1A:
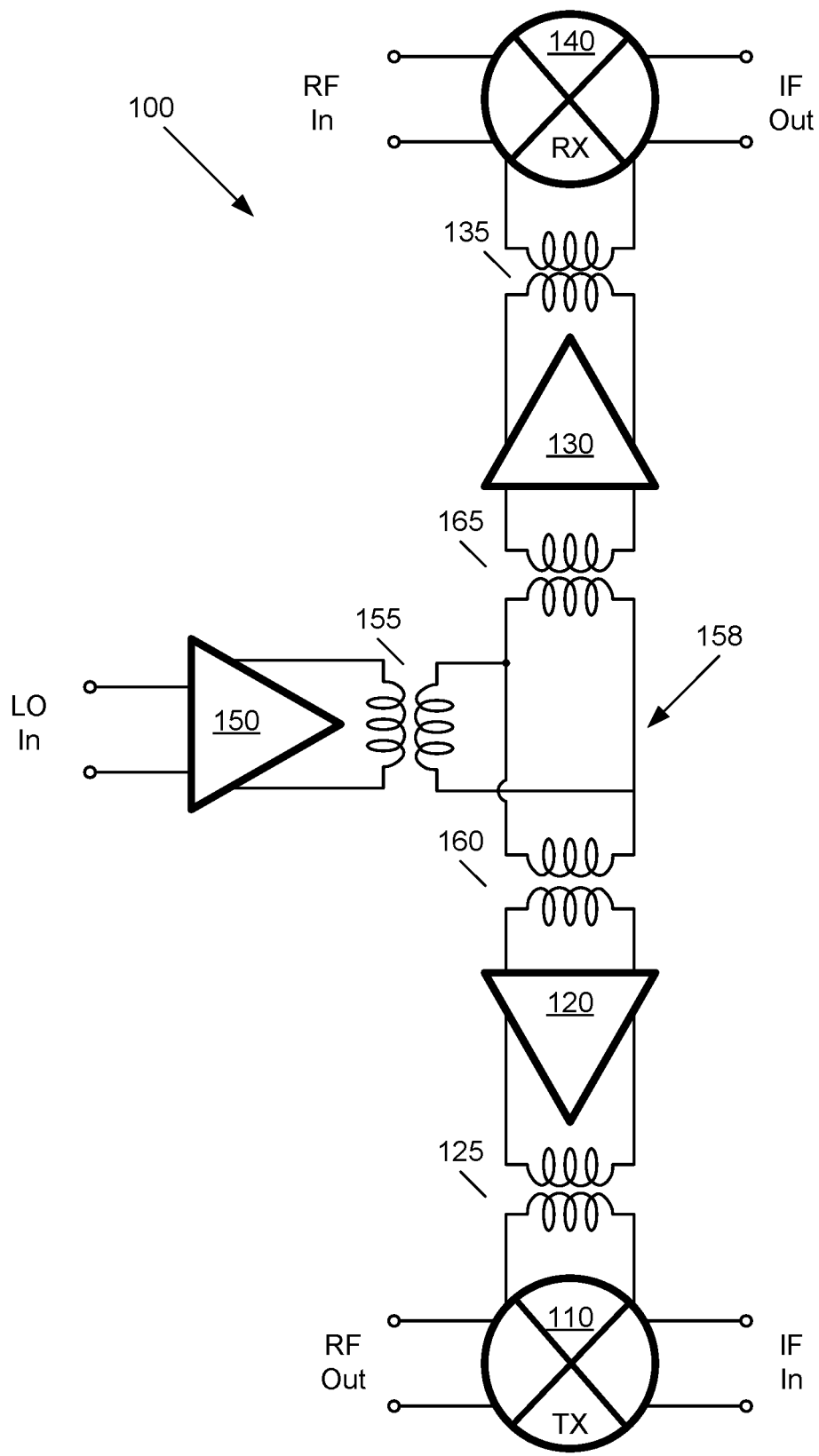
FIGS. 1A and 1B illustrate exemplary LO signal distribution networks that include separate signal branches for a transmit (TX) mixer and a receive (RX) mixer.

FIG. 1A illustrates an LO signal distribution network 100 that distributes an LO signal to a TX mixer 110 and an RX mixer 140 on two separate signal branches or paths. The LO signal is buffered in a common LO buffer 150 that has an associated common transformer 155 that boosts the power of the LO signal from the common LO buffer 150. A power splitting network 158 (e.g., a Wilkinson combiner, transmission line T-junction, or transformer power splitter) includes a transformer 160 for the transmit branch and a transformer 165 for the receive branch. A TX LO buffer 120 receives the LO signal from the transformer 160 and provides the LO signal, boosted by transformer 125 to the TX mixer 110. Similarly, a RX LO buffer 130 receives the LO signal from the transformer 165 and provides the LO signal, boosted by transformer 135 to the RX mixer 140.

The LO signal distribution network 100 limits flexibility in circuit layout because the LO signal generation circuitry (not shown) must be located between the TX chain and the RX chain. Further, use of a power splitter network (i.e., network 158) in differential LO signal distribution circuits tends to have systematic asymmetry in the layout which translates into gain/phase imbalance. This becomes even more challenging when quadrature LO signals (i.e., having separate I and Q component signals) are distributed together. Also, power splitting networks have to maintain an impedance matching condition in both TX and RX mode. This means that the layout illustrated in FIG. 1A includes at least three LO buffers to match the mixers' impedances.

Figure 1B:
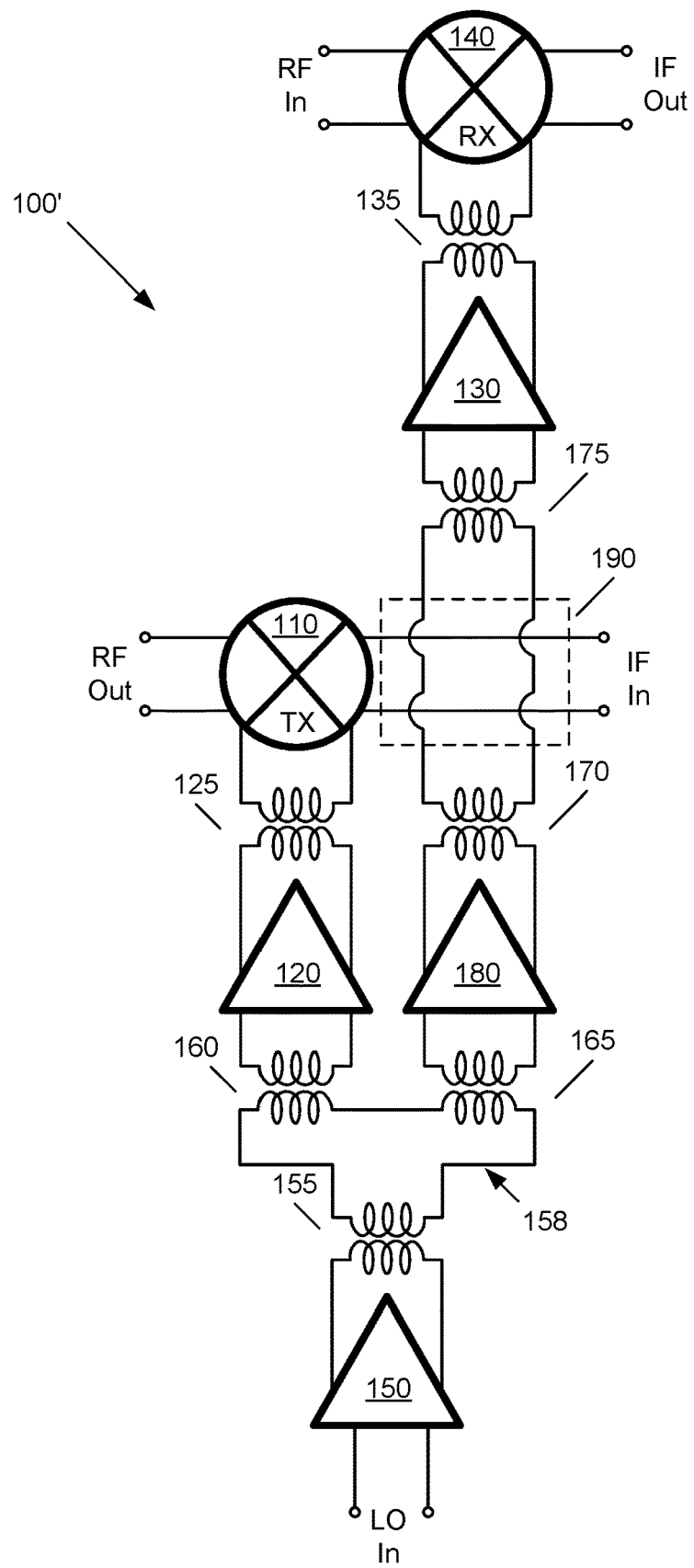

FIG. 1B illustrates an LO signal distribution network 100' in which the LO signal source (not shown) is located outside the TX chain and the RX chain. As with the network 100 of FIG. 1A, the network 100' includes a TX branch and a separate RX branch. Locating the LO signal source outside the TX chain and RX chain is often preferable because it allows for more flexibility in floor planning. Similar to the LO signal distribution network 100 of FIG. 1A, in the network 100' the LO signal is buffered in a common LO buffer 150 that has an associated common transformer 155 that boosts the power of the LO signal from the common LO buffer 150. A power splitting network 158 (e.g., a Wilkinson combiner, transmission line T-junction, or transformer power splitter) includes a transformer 160 for the transmit branch and a transformer 165 for the receive branch. A TX LO buffer 120 receives the LO signal from the transformer 160 and provides the LO signal, boosted by transformer 125 to the TX mixer 110.

Because the LO signal source is located outside the TX chain and RX chain, the RX chain crosses over the interface of the TX mixer 110 (the crossover being indicated generally as 190). In other examples, the TX chain may cross over the interface of the RX mixer. The increase in length of the RX chain due to the crossover incurs additional losses and an additional LO buffer 180 (and additional transformer stages 170, 175) are used to match the mixer impedance. The additional LO buffer 180 and transformer stages 170, 175 are disposed between a transformer 165 associated with the power splitting network and a RX LO buffer 130. The RX LO buffer 130 receives the LO signal from the transformer 175 and provides the LO signal, boosted by transformer 135, to the RX mixer 140. A significant disadvantage to the LO signal distribution network 100' is the cross over in routing between the TX chain and the RX chain. The cross over can be a source of spurious coupling and additional parasitic capacitance. Further, as compared to the LO distribution network 100 of FIG. 1A, an additional buffer (e.g., buffer 180) is necessary to compensate for the increase in routing length and to maintain signal strength.

Described herein are LO signal distribution networks, systems, methods, and circuitries that couple a TX mixer and a RX LO buffer in a cascaded manner to the same LO signal line or path instead of in separate network branches. This cascaded arrangement simplifies LO signal distribution without relying on power splitting circuitry or degrading performance due to metal crossovers. Control circuitry selectively activates the TX mixer or the RX LO buffer with minimal loss and/or loading on buffering stages. The cascaded arrangement allows the LO generation/distribution network to be placed outside the TX chain and RX chain, providing greater flexibility in floor planning without requiring a power splitting network, routing crossover, or the additional LO buffer of FIG. 1B.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable medium and/or firmware that confer(s), at least in part, the functionality of the electronic components.

It will be understood that when an element is referred to as being "coupled" or "connected" to another element, it can be physically coupled or connected to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIGS. 2A-2C illustrate an exemplary LO signal distribution network 200 that includes an RX mixer 240 and RX LO buffer 230 coupled in the same LO signal path with a TX mixer 210. The network 200 includes a common LO buffer 250 that receives the LO signal from an LO signal source or generation circuitry (not shown). A transformer 255 boosts the power of the LO signal from the buffer and couples the LO signal to an LO signal path that is defined by first LO signal line 205a and second LO signal line 205b. The TX mixer 210 receives the LO signal on the signal lines 205a, 205b and uses the LO signal to upconvert an input intermediate frequency (IF) signal to generate an upconverted TX signal at a radio frequency (RF). The RX LO buffer receives the LO signal on the signal lines 205a, 205b for providing to the RX mixer 240. A transformer 235 boosts the power of the LO signal from the RX LO buffer 230. The RX mixer 240 receives the boosted LO signal from the RX LO buffer 230 and uses the LO signal to downconvert a received radio frequency (RF) signal to generate a downconverted RX signal at an intermediate frequency (IF).

This cascaded arrangement of the TX mixer 210 and the RX LO buffer 230 is in contrast to LO signal distribution networks that include the RX mixer and TX mixer in different branches as illustrated in FIGS. 1A and 1B. It can be seen that the TX mixer 210 and RX LO buffer 230 are both coupled to the same signal path that is defined by the first signal line 205a and the second signal line 205b. When the LO signal is a differential signal, the first signal line 205a conducts a positive polarity of the differential LO signal and the second signal line 205b conducts a negative polarity of the differential LO signal. For the purposes of this description, the term "cascaded" means that two components are coupled in the same signal path and serve as a single load, such as the TX mixer 210 and the RX LO buffer 230.

Control circuitry 290 controls the TX mixer 210 and the RX LO buffer 230, in response to a mode selection signal, to selectively activate the TX mixer 210 and the RX LO buffer 230 such that only a single one of the TX mixer or the RX LO buffer is active at any given time. FIG. 2B illustrates the LO signal distribution network 200 in transmit mode. The control circuitry 290 receives a TX mode selection signal and, in response, deactivates the RX LO buffer 230 and the RX mixer 240 while activating the TX mixer 210.

Thus, in TX mode, the LO signal power is delivered to the transmit mixer 210. FIG. 2C illustrates the LO signal distribution network 200 in receive mode. The control circuitry 290 receives an RX mode selection signal and, in response, deactivates the mixer 210 while activating the RX LO buffer 230 and RX mixer 240. Thus, in receive mode, the LO signal power is delivered to the RX LO buffer.

It can be seen that the LO signal distribution network 200 does not include a TX buffer or power splitting circuitry which reduces the component count and power consumption as compared to the networks of FIGS. 1A and 1B. The network does not include any crossover in routing between the interface of the TX mixer and the RX LO buffer. This reduces any spurious coupling and parasitic capacitance. The TX mixer and RX LO buffer serve as a single load to the common LO buffer 250 and present the same matching network to the common LO buffer 250 in both TX mode and RX mode. In some examples, the positions of the TX mixer 210 and the RX LO buffer 230/RX mixer 240 relative to the common buffer 250 are switched.

Figure 3:
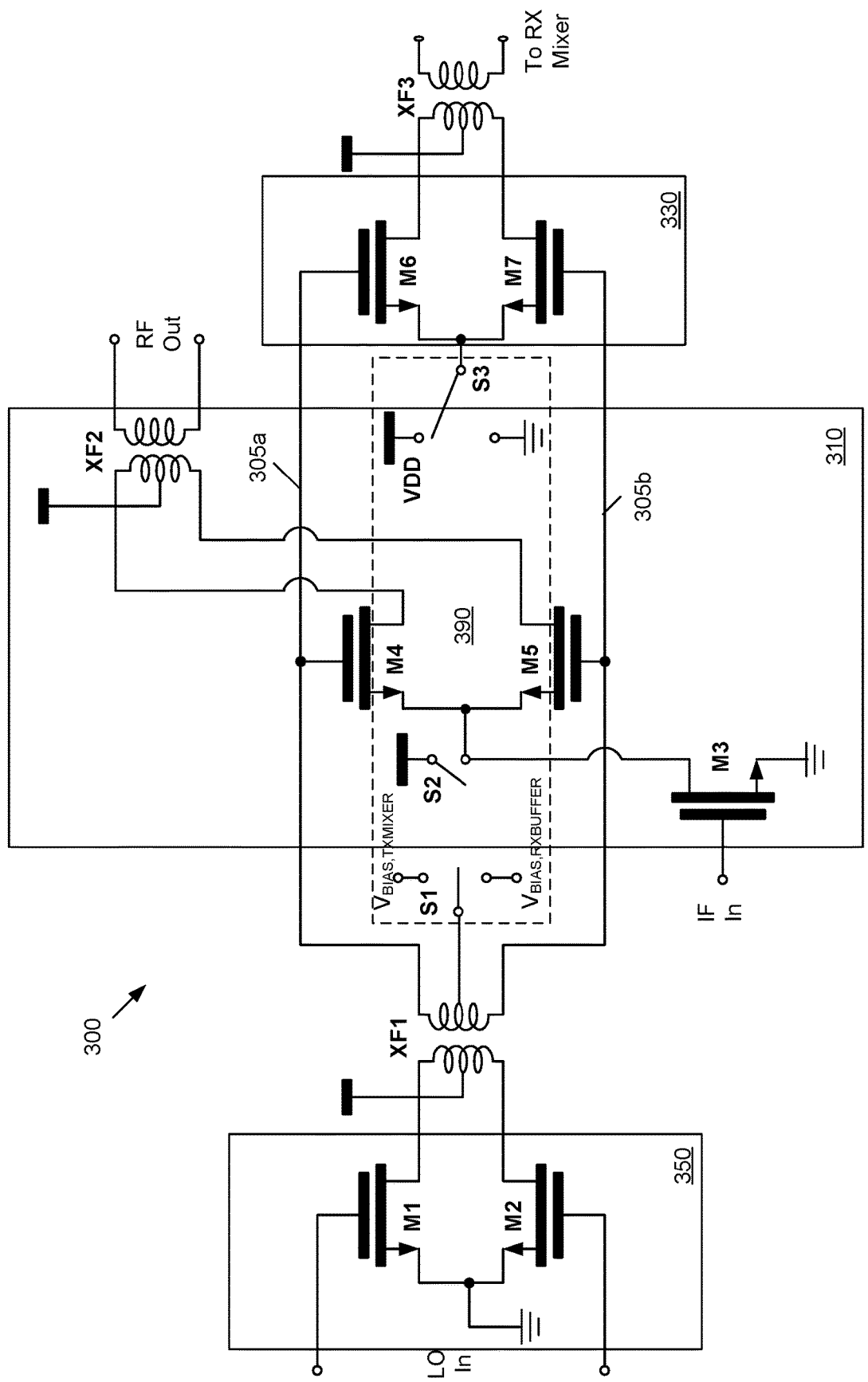
FIG. 3 illustrates an exemplary LO signal distribution network that includes a TX mixer and RX LO buffer arranged in a cascaded manner in accordance with various aspects described.

FIG. 3 illustrates an exemplary LO distribution network 300 that includes a common LO buffer 350 and an LO signal path defined by a first signal line 305a and a second signal line 305b. A TX mixer 310 is coupled between the first signal line 305a and the second signal line 305b. An RX LO buffer 330 is also coupled between the first signal line 305a and the second signal line 305b. The LO signal flows from the common LO buffer 350 on the first signal line 305a and the second signal line 305b to both the TX mixer 310 and the RX LO buffer 330.

The common LO buffer 350 includes a common-source differential pair of devices M1, M2. A transformer matching network XF1 boosts the power of the LO signal from the common LO buffer 350. The TX mixer 310 is a single-balanced active mixer that includes devices M3, M4, M5 and a transformer matching network XF2. The RX LO buffer 330 includes a common-source differential pair of buffer devices M6, M7. A transformer matching network XF3 boosts the power of the LO signal transferred from the RX LO buffer 330 to the RX mixer (not shown).

Control circuitry 390 includes three switches S1, S2, S3 which change the network 300 between TX operating mode and RX operating mode configurations. The switches also provide minimum off-state capacitance for the mixer switching devices (M4, M5) and the RX LO buffer devices (M6, M7).

Figure 3A:
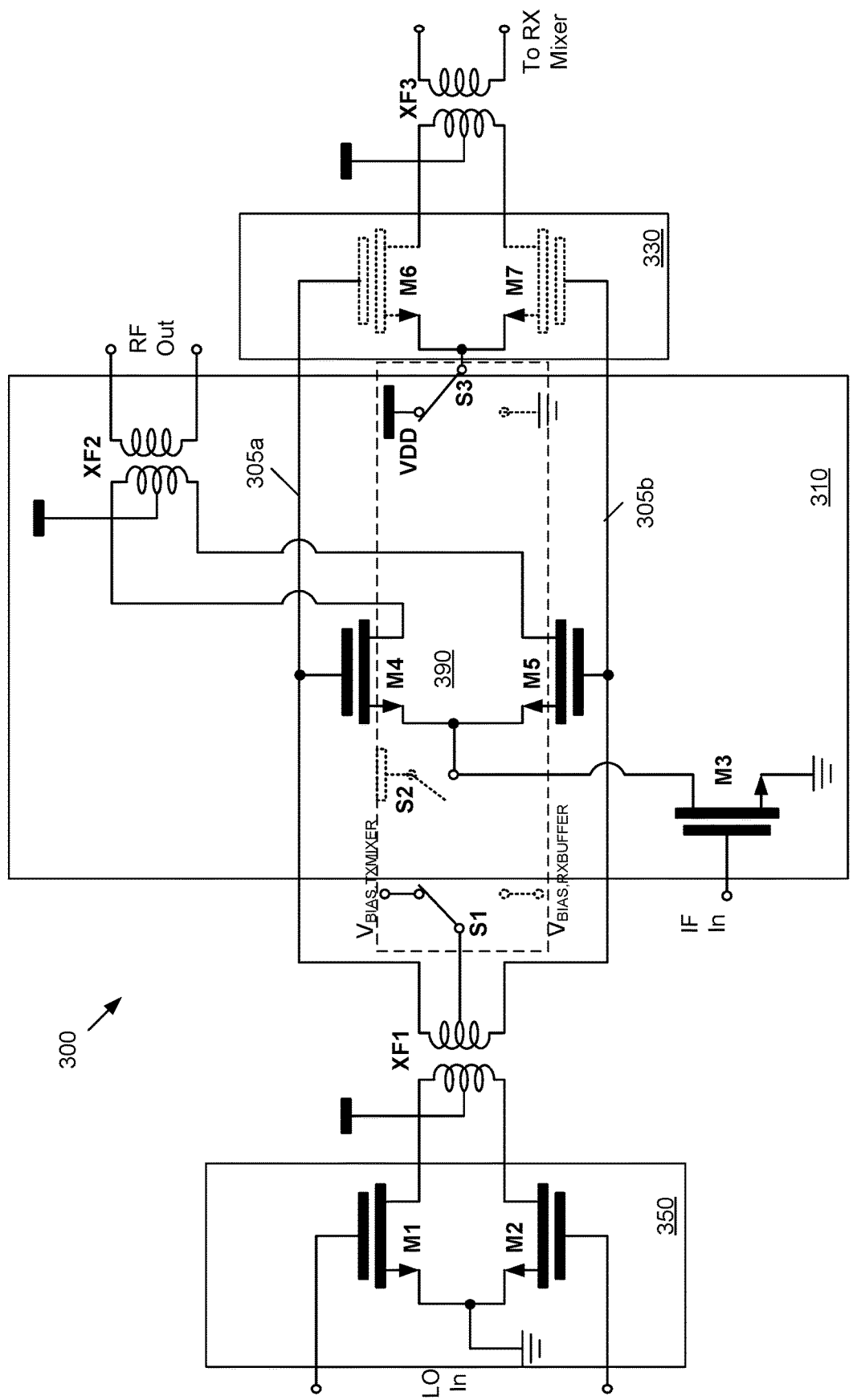
FIG. 3A illustrates the exemplary LO signal distribution of FIG. 3 in a transmit mode.

FIG. 3A illustrates the exemplary LO signal distribution network 300 in TX mode. Bias switch S1 connects a center tap bias of the transformer XF1 to the TX mixer bias voltage. TX mixer switch S2 is opened so that the IF TX input signal through device M3 can be fed into the mixer switch devices M4, M5. In this manner the control circuitry 390 activates the TX mixer 310 in TX mode. RX LO buffer switch S3 connects the differential pair M6, M7 to supply voltage VDD, turning M6, M7 off. In this manner the control circuitry 390 de-activates the RX LO buffer 330 in TX mode. Note that the parasitic capacitance presented by de-activated RX LO buffer devices M6, M7 is minimized because the gate-source voltage of M6, M7 is negative. In TX mode, the LO signal power is transferred through the common LO buffer 350 (M1, M2) and the TX mixer 310 (M4, M5).

Figure 3B:
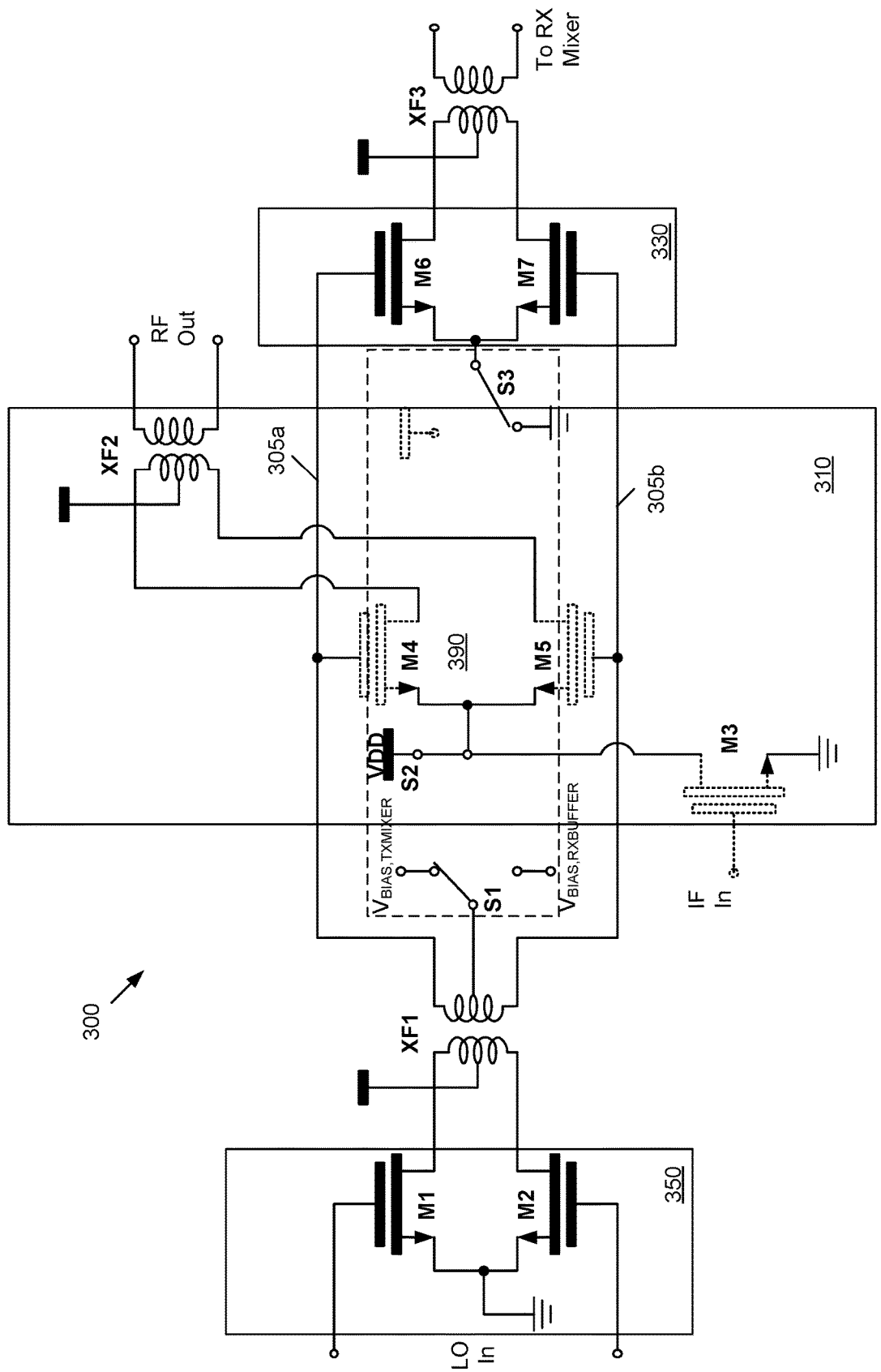
FIG. 3B illustrates the exemplary LO signal distribution of FIG. 3 in a receive mode.

FIG. 3B illustrates the exemplary LO signal distribution network 30 in RX mode. S1 connects the center tap bias of the transformer XF1 to the RX LO buffer bias voltage. S3 connects the source nodes of M6, M7 to ground to turn on M6, M7. In this manner the control circuitry 390 activates the RX LO buffer 330 on in RX mode. Note that the parasitic capacitance present by M4, M5 is minimized as the gate-source voltage for M4, M5 is negative. S2 connects the TX mixer common-source differential pair M4, M5 to VDD to turn the devices M4, M5 off. The TX IF input switch device M3 is turned off by the TX IF input signal, thereby making the drain voltage of M3 high. In this manner the control circuitry 310 de-activates the TX mixer 310 in RX mode. In RX mode, the LO signal power is transferred through the common LO buffer 350 (M1, M2) and the RX LO buffer 330 (M6, M7).

For both TX mode and RX mode, the total capacitance presented to the transformer XF1 is the gate capacitance of two active devices (e.g., transistors) and two off devices (e.g., transistors). Therefore the quality and bandwidth of the matching at the output of XF1 is maintained.

Figure 4:
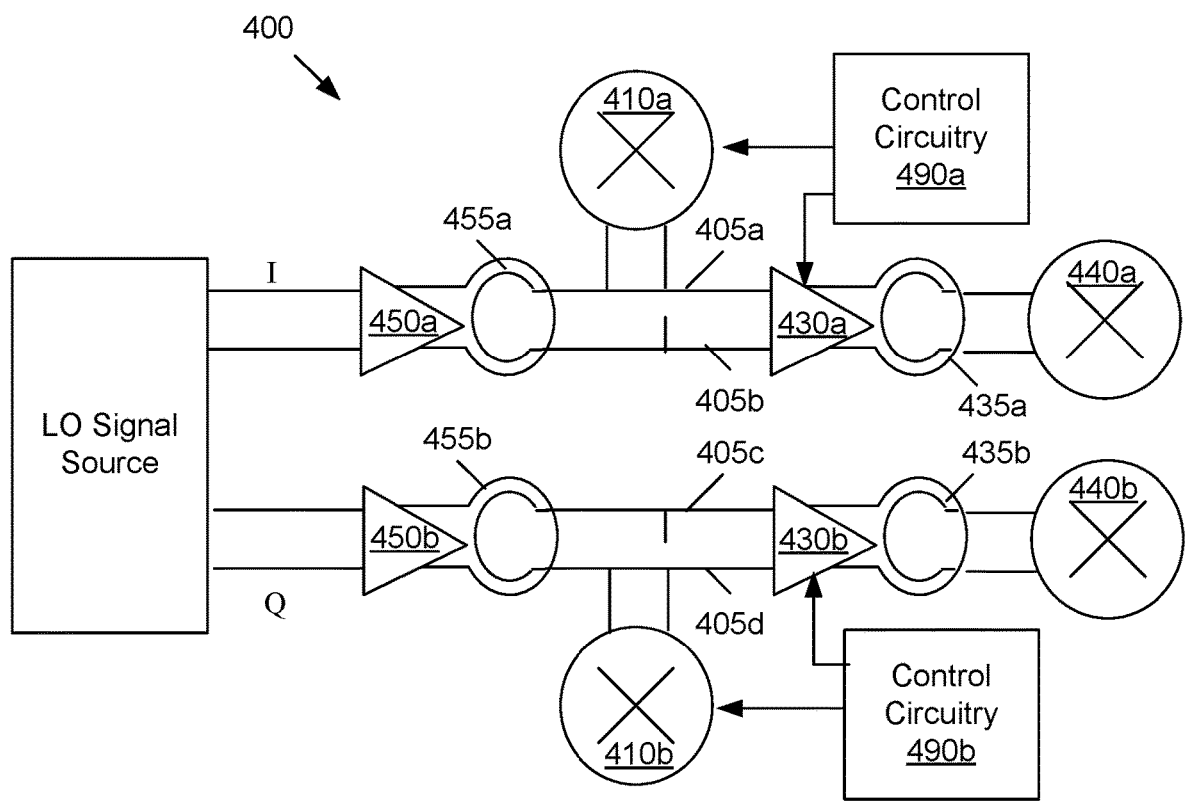
FIG. 4 illustrates another exemplary LO signal distribution network that includes a TX mixer and receive buffer arranged in a cascaded manner in accordance with various aspects described.

FIG. 4 illustrates an exemplary LO signal distribution network 400 in which double-balanced mixers are used. In this case, the LO signal source generates separate I and Q LO signal components. A separate LO signal path for each component is provided with each signal path including a cascaded TX mixer and RX LO buffer. The I signal path is defined by the signal lines 405a, 405b. The I signal path includes a common LO buffer 450a that receives the LO signal from an LO signal source. A transformer 455a boosts the power of the LO signal from the common LO buffer and couples the LO signal to the LO signal line 405a and the LO signal line 405b. An I TX mixer 410a receives the LO signal on the signal lines 405a, 405b and uses the LO signal to upconvert an input IF signal to generate an upconverted transmit signal at a radio frequency (RF).

An I RX LO buffer 430a receives and buffers the LO signal on the signal lines 405a, 405b for providing to an I RX mixer 440a. A transformer 235a boosts the power of the LO signal from the I RX LO buffer 430a. The I RX mixer 440a receives the boosted LO signal from the I RX LO buffer 430a and uses the LO signal to downconvert a received radio frequency (RF) signal to generate a down-converted signal at an intermediate frequency (IF).

Control circuitry 490a controls the I TX mixer 410a and the I RX LO buffer 430a, in response to a mode selection signal, to selectively activate the I TX mixer 410a or the I RX LO buffer 430a such that only a single one of the I TX mixer or the I RX LO buffer is active at any given time.

The Q signal path is defined by the signal lines 405c, 405d. The Q signal path includes a common LO buffer 450b that receives the LO signal from the LO signal source. A Q transformer 455b boosts the power of the LO signal from the common LO buffer and couples the LO signal to the LO signal line 405c and the LO signal line 405d. A Q TX mixer 410b receives the LO signal on the signal lines 405c, 405d and uses the LO signal to upconvert an input IF signal to generate an upconverted transmit signal at a radio frequency (RF).

A Q RX LO buffer 430b receives and buffers the LO signal on the signal lines 405c, 405d for providing to a Q RX mixer 440b. A Q transformer 235b boosts the power of the LO signal from the Q RX LO buffer 430b. The Q RX mixer 440b receives the boosted LO signal from the Q RX LO buffer 430b and uses the LO signal to downconvert a received radio frequency (RF) signal to generate a down-converted signal at an intermediate frequency (IF).

Control circuitry 490b controls the Q TX mixer 410b and the Q RX LO buffer 430b, in response to a mode selection signal, to selectively activate the Q TX mixer 410b or the Q RX LO buffer 430b such that only a single one of the Q TX mixer or the Q RX LO buffer is active at any given time.

Figure 5:
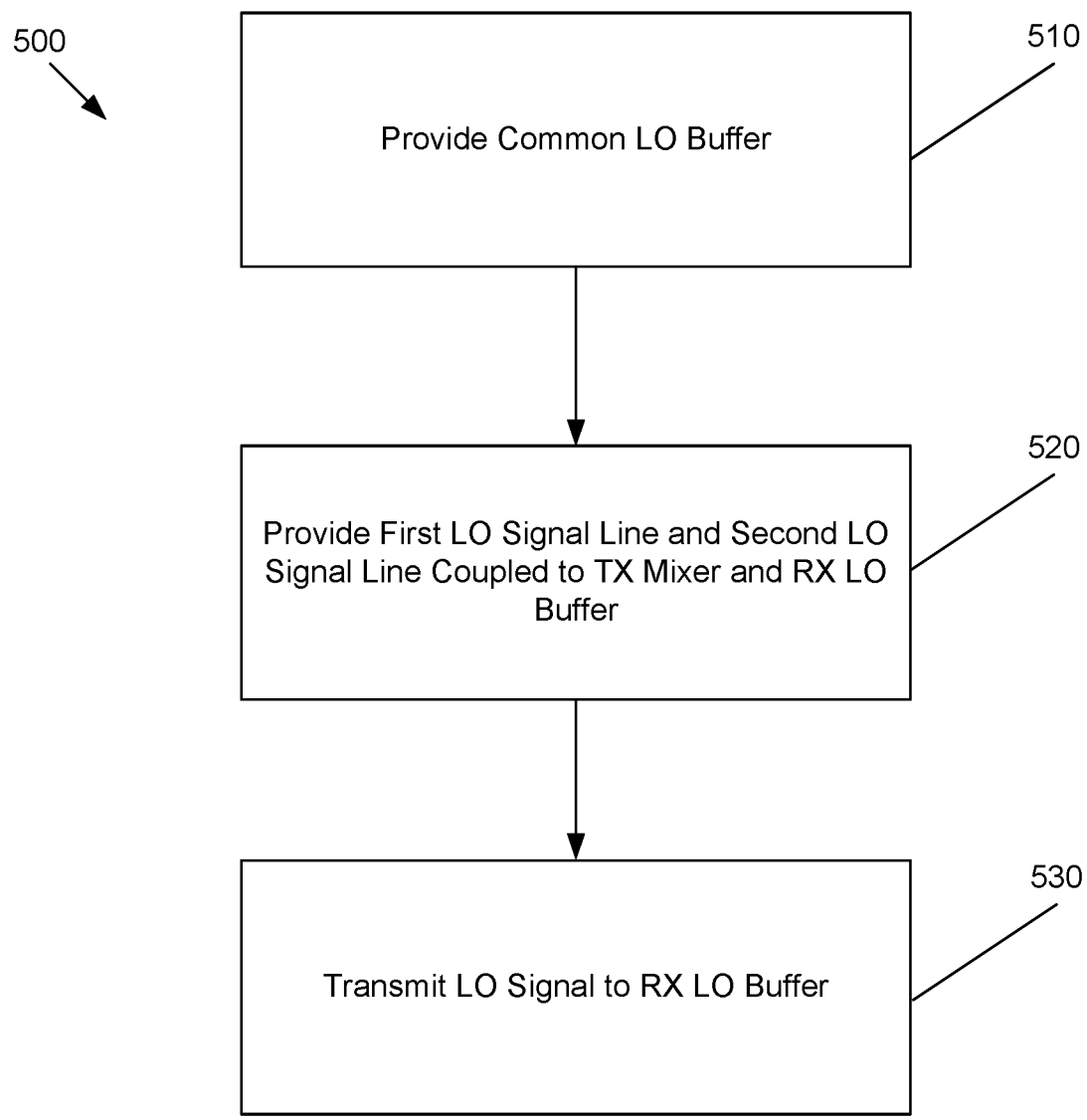
FIG. 5 illustrates an exemplary flow diagram of an example method of distributing an LO signal to a cascaded TX mixer and a RX LO buffer in accordance with various aspects described.

FIG. 5 illustrates a flow diagram outlining an exemplary method 500 to distribute a local oscillator (LO) signal to a transmit (TX) mixer and a receive (RX) mixer. The method 500 may be performed by LO signal distribution networks 200, 300, and/or 400 of FIGS. 2, 3, and 4, respectively. The method includes, at 510, providing a common LO buffer configured to buffer the LO signal. At 520 the method includes providing a first LO signal line and a second LO signal line that connect the common LO buffer to the transmit (TX) mixer and to an RX LO buffer configured to buffer the LO signal and to provide the LO signal to the RX mixer. The RX LO buffer is coupled to the first LO signal line and the second LO signal line and the TX mixer is coupled to the first LO signal line and the second LO signal line. At 530, the LO signal is transmitted to the RX LO buffer.

FIG. 6A illustrates an exemplary millimeter wave communication circuitry 600 which may embody the transceivers that include the LO signal distribution networks of FIGS. 2-4 according to some aspects. Circuitry 600 is alternatively grouped according to functions. Components as shown in 600 are shown here for illustrative purposes and may include other components not shown here in FIG. 6A.

Millimeter wave communication circuitry 600 may include protocol processing circuitry 605, which may implement one or more of medium access control (MAC), radio link control (RLC), packet data convergence protocol (PDCP), radio resource control (RRC) and non-access stratum (NAS) functions. Protocol processing circuitry 605 may include one or more processing cores (not shown) to execute instructions and one or more memory structures (not shown) to store program and data information.

Millimeter wave communication circuitry 600 may further include digital baseband circuitry 610, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 600 may further include transmit circuitry 615, receive circuitry 620 and/or antenna array circuitry 630.

Millimeter wave communication circuitry 600 may further include radio frequency (RF) circuitry 625. In an aspect of the invention, RF circuitry 625 may include multiple parallel RF chains for one or more of transmit or receive functions, each coupled to one or more antennas of the antenna array 630.

In an aspect of the disclosure, protocol processing circuitry 605 may include one or more instances of control circuitry (not shown) to provide control functions for one or more of digital baseband circuitry 610, transmit circuitry 615, receive circuitry 620, and/or radio frequency circuitry 625.

FIGS. 6B and 6C illustrate examples for transmit circuitry 615 in FIG. 6A in some aspects.

The exemplary transmit circuitry 615 of FIG. 6B may include one or more of digital to analog converters (DACs) 640, analog baseband circuitry 645, up-conversion circuitry 650 and filtering and amplification circuitry 655. In another aspect, 6C illustrates an exemplary transmit circuitry 615 which includes digital transmit circuitry 665 and output circuitry 670.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for distributing an LO signal according to embodiments and examples described herein.

Example 1 is a local oscillator (LO) distribution network, including a common LO buffer configured to buffer an LO signal; a receive (RX) LO buffer configured to receive the LO signal and buffer the LO signal and to provide the LO signal to an RX mixer, wherein the RX mixer is configured to receive the LO signal and an RX signal and generate a downconverted signal; a first LO signal line and a second LO signal line configured to conduct the LO signal from the common LO buffer to the RX LO buffer, wherein the RX LO buffer is coupled to the first LO signal line and the second LO signal line; and a transmit (TX) mixer coupled to the first LO signal line and the second LO signal line, wherein the TX mixer is configured to receive the LO signal and a TX signal and generate an upconverted TX signal.

Example 2 includes the subject matter of example 1, including or omitting optional elements, wherein the first LO signal line and the second LO signal line are configured to conduct a positive polarity of a differential LO signal and a negative polarity of the differential LO signal, respectively.

Example 3 includes the subject matter of example 1, including or omitting optional elements, wherein the TX mixer and the RX LO buffer include a single load to the common LO buffer.

Example 4 includes the subject matter of example 1, including or omitting optional elements, further including control circuitry configured to selectively activate the TX mixer and the RX LO buffer such that only a single one of the TX mixer or the RX LO buffer is active at any given time.

Example 5 includes the subject matter of example 4, including or omitting optional elements, wherein the control circuitry includes a first switch configured to: couple the first LO signal line and the second LO signal line to a TX mixer bias voltage in response to the LO distribution network being in a TX mode; and couple the first LO signal line and the second LO signal line to an RX LO buffer bias voltage in response to the LO distribution network being in an RX mode.

Example 6 includes the subject matter of example 4, including or omitting optional elements, wherein the control circuitry includes: a second switch configured to activate the TX mixer in response to the LO distribution network being in a TX mode or deactivate the TX mixer in response to the LO distribution network being in an RX mode; and a third switch configured to activate the RX LO buffer in response to the LO distribution network being in the RX mode or deactivate the RX LO buffer in response to the LO distribution network being in the TX mode.

Example 7 includes the subject matter of example 6, including or omitting optional elements, wherein: the TX mixer includes a pair of mixer switching devices including a first mixer switching device coupled at its gate to the first LO signal line and a second mixer switching device coupled at its gate to the second LO signal line; and the RX LO buffer includes a pair of buffer devices including a first buffer device coupled at its gate to the first LO signal line and a second buffer device coupled at its gate to the second LO signal line.

Example 8 includes the subject matter of example 7, including or omitting optional elements, wherein the control circuitry is configured to, when the LO distribution network is in the TX mode, control the second switch to couple source nodes of the first mixer switching device and the second mixer switching device to a TX input; and control the third switch to couple source nodes of the first buffer device and the second buffer device to a supply voltage. When the LO distribution network is in the RX mode, the control circuitry is configured to control the second switch to couple the source nodes of the first mixer switching device and the second mixer switching device to the supply voltage; and control the third switch to couple the source nodes of the first buffer device and the second buffer device to ground.

Example 9 is a method configured to distribute a local oscillator (LO) signal to a transmit (TX) mixer and a receive (RX) mixer. The method includes providing a common LO buffer configured to buffer the LO signal; providing a first LO signal line and a second LO signal line that couple the common LO buffer to the transmit (TX) mixer and to an RX LO buffer configured to buffer the LO signal and to provide the LO signal to the RX mixer, wherein the RX LO buffer is coupled to the first LO signal line and the second LO signal line and the TX mixer is coupled to the first LO signal line and the second LO signal line; and transmitting the LO signal from the common LO buffer to the RX LO buffer.

Example 10 includes the subject matter of example 9, including or omitting optional elements, wherein the first LO signal line and the second LO signal line are configured to conduct a positive polarity of a differential LO signal and a negative polarity of the differential LO signal, respectively.

Example 11 includes the subject matter of example 9, including or omitting optional elements, further including determining whether a present operating mode is TX mode or RX mode; and based on the present operating mode, selectively activating the TX mixer and the RX LO buffer such that only a single one of the TX mixer or the RX LO buffer is active at any given time.

Example 12 includes the subject matter of example 11, including or omitting optional elements, further including controlling a first switch to couple the first LO signal line and the second LO signal line to a TX mixer bias voltage in response to present operating mode being TX mode; and controlling a first switch to couple the first LO signal line and the second LO signal line to an RX LO buffer bias in response to present operating mode being RX mode.

Example 13 includes the subject matter of example 11, including or omitting optional elements, further including controlling a second switch to activate the TX mixer in response to present operating mode being TX mode or deactivate the TX mixer in response to present operating mode being RX mode; and controlling a third switch to activate the RX LO buffer in response to present operating mode being RX mode or deactivate the RX LO in response to present operating mode being TX mode.

Example 14 includes the subject matter of example 13, including or omitting optional elements, wherein the TX mixer includes a pair of mixer switching devices including a first mixer switching device coupled at its gate to the first LO signal line and a second mixer switching device coupled at its gate to the second LO signal line and the RX LO buffer includes a pair of buffer devices including a first buffer device coupled at its gate to the first LO signal line and a second buffer device coupled at its gate to the second LO signal line. The method further includes, in response to present operating mode being TX mode, controlling the second switch to couple source nodes of the first mixer switching device and the second mixer switching device to a TX input; and controlling the third switch to couple source nodes of the first buffer device and the second buffer device to a supply voltage. The method includes, in response to present operating mode being RX, controlling the second switch to couple the source nodes of the first mixer switching device and the second mixer switching device to the supply voltage; and controlling the third switch to couple the source nodes of the first buffer device and the second buffer device to ground.

Example 15 is a control circuitry for a local oscillator (LO) signal distribution network that operates in a receive (RX) mode or a transmit (TX) mode, including a TX mixer switch configured to activate and deactivate a transmit mixer, wherein the transmit mixer is coupled to a first LO signal line and a second LO signal line; and a RX LO buffer switch configured to activate and deactivate an RX LO buffer, wherein the RX LO buffer is coupled to a first LO signal line and a second LO signal line.

Example 16 includes the subject matter of example 15, including or omitting optional elements, wherein the TX mixer includes a pair of mixer switching devices including a first mixer switching device coupled at its gate to the first LO signal line and a second mixer switching device coupled at its gate to the second LO signal line and the RX LO buffer includes a pair of buffer devices including a first buffer device coupled at its gate to the first LO signal line and a second buffer device coupled at its gate to the second LO signal line. The control circuitry is configure to, in response to present operating mode being TX mode, couple source nodes of the first mixer switching device and the second mixer switching device to a TX input with the TX mixer switch; and couple source nodes of the first buffer device and the second buffer device to a supply voltage with the RX LO buffer switch.

Example 17 includes the subject matter of example 15, including or omitting optional elements, wherein the TX mixer includes a pair of mixer switching devices including a first mixer switching device coupled at its gate to the first LO signal line and a second mixer switching device coupled at its gate to the second LO signal line and the RX LO buffer includes a pair of buffer devices including a first buffer device coupled at its gate to the first LO signal line and a second buffer device coupled at its gate to the second LO signal line. The control circuitry is configure to, in response to present operating mode being RX mode, couple source nodes of the first mixer switching device and the second mixer switching device to a supply voltage with the TX mixer switch; and couple source nodes of the first buffer device and the second buffer device to ground with the RX LO buffer switch.

Example 18 includes the subject matter of example 15, including or omitting optional elements, further including a first switch to configured tocouple the first LO signal line and the second LO signal line to a TX mixer bias voltage in response to present operating mode being TX mode; and couple the first LO signal line and the second LO signal line to an RX LO buffer bias in response to present operating mode being RX mode.

Example 19 includes the subject matter of example 15, including or omitting optional elements, wherein the first LO signal line and the second LO signal line are configured to conduct a positive polarity of a differential LO signal and a negative polarity of the differential LO signal, respectively.

Example 20 includes the subject matter of example 15, including or omitting optional elements, wherein the TX mixer and the RX LO buffer include a single load to a common LO buffer.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A local oscillator (LO) distribution network, comprising:
   a common LO buffer configured to buffer an LO signal;
   a receive (RX) LO buffer configured to receive the LO signal and buffer the LO signal and to provide the LO signal to an RX mixer, wherein the RX mixer is configured to receive the LO signal and an RX signal and generate a downconverted signal;
   a first LO signal line and a second LO signal line configured to conduct the LO signal from the common LO buffer to the RX LO buffer, wherein the RX LO buffer is coupled to the first LO signal line and the second LO signal line; and
   a transmit (TX) mixer coupled to the first LO signal line and the second LO signal line, wherein the TX mixer is configured to receive the LO signal and a TX signal and generate an upconverted TX signal.

2. The LO distribution network of claim 1, wherein the first LO signal line and the second LO signal line are configured to conduct a positive polarity of a differential LO signal and a negative polarity of the differential LO signal, respectively.

3. The LO distribution network of claim 1, wherein the TX mixer and the RX LO buffer comprise a single load to the common LO buffer.

4. The LO distribution network of claim 1, further comprising control circuitry configured to selectively activate the TX mixer and the RX LO buffer such that only a single one of the TX mixer or the RX LO buffer is active at any given time.

5. The LO distribution network of claim 4, wherein the control circuitry comprises a first switch configured to:
   couple the first LO signal line and the second LO signal line to a TX mixer bias voltage in response to the LO distribution network being in a TX mode; and
   couple the first LO signal line and the second LO signal line to an RX LO buffer bias voltage in response to the LO distribution network being in an RX mode.

6. The LO distribution network of claim 4, wherein the control circuitry comprises:
   a second switch configured to activate the TX mixer in response to the LO distribution network being in a TX mode or deactivate the TX mixer in response to the LO distribution network being in an RX mode; and
   a third switch configured to activate the RX LO buffer in response to the LO distribution network being in the RX mode or deactivate the RX LO buffer in response to the LO distribution network being in the TX mode.

7. The LO distribution network of claim 6, wherein:
   the TX mixer comprises a pair of mixer switching devices comprising a first mixer switching device coupled at its gate to the first LO signal line and a second mixer switching device coupled at its gate to the second LO signal line; and
   the RX LO buffer comprises a pair of buffer devices comprising a first buffer device coupled at its gate to the first LO signal line and a second buffer device coupled at its gate to the second LO signal line.

8. The LO distribution network of claim 7, wherein the control circuitry is configured to:
when the LO distribution network is in the TX mode,
control the second switch to couple source nodes of the first mixer switching device and the second mixer switching device to a TX input; and
control the third switch to couple source nodes of the first buffer device and the second buffer device to a supply voltage; and
when the LO distribution network is in the RX mode,
control the second switch to couple the source nodes of the first mixer switching device and the second mixer switching device to the supply voltage; and
control the third switch to couple the source nodes of the first buffer device and the second buffer device to ground.

9. A method configured to distribute a local oscillator (LO) signal to a transmit (TX) mixer and a receive (RX) mixer, the method comprising:
providing a common LO buffer configured to buffer the LO signal;
providing a first LO signal line and a second LO signal line that couple the common LO buffer to the transmit (TX) mixer and to an RX LO buffer configured to buffer the LO signal and to provide the LO signal to the RX mixer,
wherein the RX LO buffer is coupled to the first LO signal line and the second LO signal line and the TX mixer is coupled to the first LO signal line and the second LO signal line; and
transmitting the LO signal from the common LO buffer to the RX LO buffer.

10. The method of claim 9, wherein the first LO signal line and the second LO signal line are configured to conduct a positive polarity of a differential LO signal and a negative polarity of the differential LO signal, respectively.

11. The method of claim 9, further comprising:
determining whether a present operating mode is TX mode or RX mode; and
based on the present operating mode, selectively activating the TX mixer and the RX LO buffer such that only a single one of the TX mixer or the RX LO buffer is active at any given time.

12. The method of claim 11 further comprising:
controlling a first switch to couple the first LO signal line and the second LO signal line to a TX mixer bias voltage in response to present operating mode being TX mode; and
controlling a first switch to couple the first LO signal line and the second LO signal line to an RX LO buffer bias in response to present operating mode being RX mode.

13. The method of claim 11, further comprising:
controlling a second switch to activate the TX mixer in response to present operating mode being TX mode or deactivate the TX mixer in response to present operating mode being RX mode; and
controlling a third switch to activate the RX LO buffer in response to present operating mode being RX mode or deactivate the RX LO in response to present operating mode being TX mode.

14. The method of claim 13, wherein the TX mixer comprises a pair of mixer switching devices comprising a first mixer switching device coupled at its gate to the first LO signal line and a second mixer switching device coupled at its gate to the second LO signal line and the RX LO buffer comprises a pair of buffer devices comprising a first buffer device coupled at its gate to the first LO signal line and a second buffer device coupled at its gate to the second LO signal line, wherein the method further comprises:
in response to present operating mode being TX mode,
controlling the second switch to couple source nodes of the first mixer switching device and the second mixer switching device to a TX input; and
controlling the third switch to couple source nodes of the first buffer device and the second buffer device to a supply voltage; and
in response to present operating mode being RX mode,
controlling the second switch to couple the source nodes of the first mixer switching device and the second mixer switching device to the supply voltage; and
controlling the third switch to couple the source nodes of the first buffer device and the second buffer device to ground.

* * * * *